United States Patent [19]
Hall, Jr.

[11] Patent Number: 5,997,803
[45] Date of Patent: Dec. 7, 1999

[54] THERMOELEMENTS PREPARED FROM POWDERED ALLOYS AND THERMOCOUPLES MADE THEREFROM

[75] Inventor: Bertie Forrest Hall, Jr., Ann Arbor, Mich.

[73] Assignee: Hoskins Manufacturing Company, Detroit, Mich.

[21] Appl. No.: 09/085,469

[22] Filed: May 27, 1998

[51] Int. Cl.[6] ........................... B22F 3/20
[52] U.S. Cl. ................... 419/3; 419/41
[58] Field of Search ........................ 419/3, 41

[56] References Cited

U.S. PATENT DOCUMENTS

| | | | |
|---|---|---|---|
| 4,408,088 | 10/1983 | Foote | 136/226 |
| 5,017,437 | 5/1991 | Martin et al. | 428/588 |
| 5,121,994 | 6/1992 | Molitoris | 374/179 |
| 5,304,602 | 4/1994 | Yamamoto et al. | 505/433 |

*Primary Examiner*—Daniel J. Jenkins
*Attorney, Agent, or Firm*—Brooks & Kushman P.C.

[57] ABSTRACT

A method for making thermocouple wire from powdered alloys and metals. The metal or alloy is atomized from its liquid state into a powdered state as it leaves a melting vat. The powder is then compacted and cold worked to form thermocouple wire. Different lots of a powdered alloy or a powdered metal may be blended to reduce the calibration error of the resultant thermocouple wire.

28 Claims, 2 Drawing Sheets

THERMOELEMENTS PREPARED FROM POWDERED ALLOYS AND THERMOCOUPLES MADE THEREFROM

TECHNICAL FIELD

The invention is related to the field of thermocouples and in particular to thermocouple wires made from powdered alloys.

BACKGROUND ART

A goal of the manufacturers of thermocouple wire is to reliably produce thermocouple wire having thermoelectric properties which are as close as possible to a calibration standard. Currently, in the manufacture of thermocouple wire, it is necessary to modify the chemistry of the alloy to obtain the desired thermoelectric properties, thereby assuring an accurate measurement of temperature. This modification is more art than science, as the effect of small additions of reactive metals to the molten batch on the thermoelectric properties will vary with the melting techniques and the skill of the melter.

This problem is further aggravated by the fact that as an alloy is poured to form an ingot from which the wire is to be formed, the cooling of the alloy melt may go through two or more freeze temperatures starting at the periphery of the ingot and progressing to the center. For example, when solidifying a typical nickel-chromium alloy, such as used in thermocouple wires, an alloy consisting of 95% nickel and 5% chromium will solidify at the periphery while an alloy composition having 73% nickel and 27% chromium will solidify in the central region of the poured ingot. These differences in the chemical composition in various regions of the ingot often manifest themselves in thermoelectric properties of the final wire product. As a result, different segments of the drawn thermocouple wire may have different chemical compositions and different thermoelectric properties. Where the thermoelectric properties of the drawn wire are not within predetermined acceptable limits from a standard electro-motive force (emf) versus temperature curve, the entire ingot has to be scrapped. This is not only a waste of time and material, but also significantly reduces the production capability of the manufacture of thermocouple wires.

SUMMARY OF THE INVENTION

The invention is a method for making thermocouple wire from powdered metals and powdered alloys. The powdered metals and alloys are produced by the disintegration of a liquid stream of molten metal or alloy which solidifies to form a lot or batch of powdered metal or powdered alloy. The powdered metal or alloy is subsequently compacted and hot worded to form a solid billet. The solid billet is then cold worked and drawn into thermocouple wire. In the preferred embodiment, the thermoelectric properties are measured to determine a calibration error which is the difference between the thermoelectric properties of the thermocouple wire made from a powdered metal or alloy and a standard curve for that particular alloy. Different lots of powdered metals or alloys may then be blended to reduce the calibration error of the resultant thermocouple wire. In particular, the quantity, by weight, of each of the lots of powdered metals or alloys blended together are selected to minimize the calibration error of the thermocouple wire drawn from the blended powdered alloy.

OBJECT OF THE INVENTION

A first object of the invention is to make thermocouple wire from a powdered alloy to increase consistency of its thermoelectric properties.

Another object of the invention is to reduce the calibration error of the thermocouple wire by blending different lots of powdered alloy having offsetting calibration errors.

Still another object of the invention is to minimize the calibration error by selecting the ratio 35 between the quantities of the powdered alloys blended together.

Another object is to reduce grain growth at high temperatures to reduce mechanical failures by adding inert ceramic particles to be blended with the powdered lots.

Still another object is to blend selected metal powders to form a particular thermocouple alloy.

These and other objects of the invention will become more apparent from a reading of the specification in conjunction with the appended drawings.

DETAILED DESCRIPTION OF THE BEST MODE

According to the invention, an alloy having the desired chemical composition is prepared using standard melting techniques and technology. The alloy is then atomized to a fine powder in a manner to be discussed below.

Figure 1:
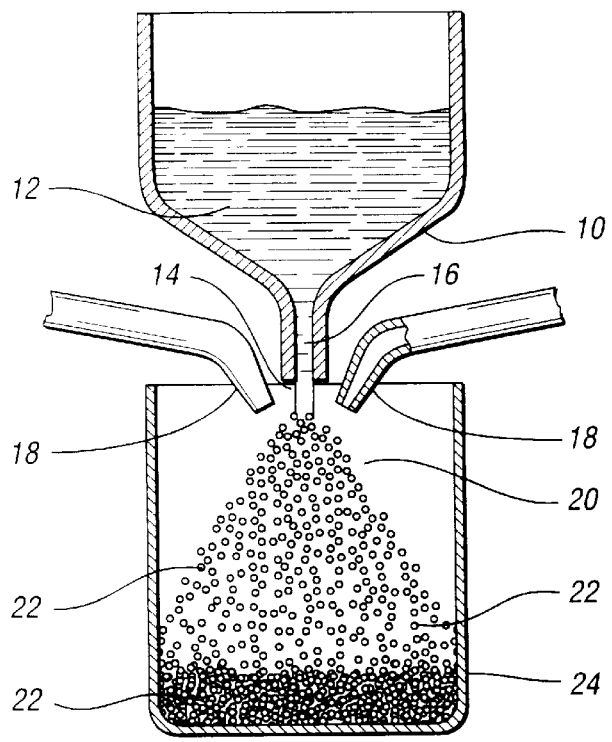
FIG. 1 shows the apparatus for making the powdered alloy.

Preferably, the alloy is prepared in a vat 10 as shown in FIG. 1. The molten alloy 12 is ejected from the bottom of the vat 10 as a liquid stream 14 through an ejection orifice 16 provided at the bottom of the vat. The stream of liquid alloy 14 is impinged by high pressure jets of a gas such as nitrogen or argon from gas jets 18. The impingement of the liquid stream of alloy 14 by the jets of gas disintegrates the stream of liquid alloy into fine droplets 20 which individually solidify to form a fine powder 22. The fine powder 22 descends into a collector 24 located at the bottom of the apparatus. Apparatus for making powdered metals and alloys, such as described above are currently used by Wyman Gordon Powder Systems of Brighton, Mich.

Alternatively, the orifice of the bottom of the vat may be designed to create a turbulence which atomizes the liquid alloy directly such as the atomization of the fuel from an automotive fuel injector. Various methods for atomizing a metal or alloy to produce a powdered metal are described in detail in the textbook INTRODUCTION OF POWDER METALLURGY by Joel S. Hirschhorn, published by American Powder Metallurgy Institute, Princeton, N.J.

The resulting powder consists of fine particles in the range from 5 to 25 microns in size. This maximizes the uniformity of an alloy in each particle since the variations in the chemistry from solidification in the cast ingot as previously discussed will be variable only within each small particle of the powdered alloy.

After being atomized, the alloy powder is degassed, and compacted at an elevated temperature and pressure to form a solid rod. Typically, the powder is compacted at a temperature in the range from 1000° C. to 1100° C. to form the compacted billet. However, it is understood that the temperature and pressure used to compact the powdered alloy will vary with the chemical composition of the alloy being compacted.

Preferably for compaction, the alloy powder is loaded into a metal can, such as a steel can, then the filled metal can is welded shut. The metal can with the alloy powder inside is then compacted and drawn to form a coated rod having the residue of the metal can extending along its external surface. The residue of the metal is then to be removed by mechanical means such as shaving or by chemical means such as an acid etch. The compacted rod with the residue of the can removed is then hot worked and drawn into wire using conventional methods.

It also has been found that compaction of the powder alloy in the can prior to being drawn into the coated rod may be omitted and that adequate compaction of the powder alloy may be accomplished during the drawing of the sealed can filled with the powder alloy.

The resulting thermocouple wire has been found to have greater uniformity of chemical composition and more uniform thermoelectric properties than achievable with products made from cast ingots.

Figure 2:
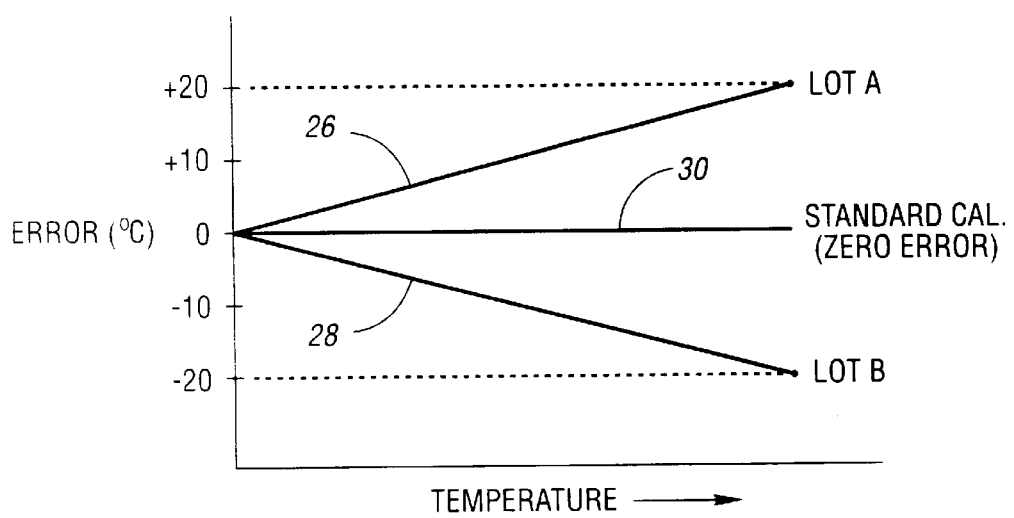
FIG. 2 is a graph showing the calibration error in degrees C. as a function of temperature of a theoretical example.

A major advantage of atomizing the alloy or metal to a powder is that it allows for fine tuning of the thermoelectric properties of the resulting thermocouple wire. This is accomplished by blending powder lots with offsetting thermoelectric properties prior to compacting to form a blended powder billet. The thermoelectric properties of thermocouple wire made from the blended powder billet have a calibration error smaller than either of the two lots taken separately. This is best illustrated by the theoretical example shown in FIG. 2. Referring to FIG. 2, the thermoelectric properties were measured and a calibration error, in ° C., versus temperature is determined. The calibration error versus temperature of a first lot, of a powdered alloy lot A, is indicated by curve 26. As shown, the calibration error of the thermoelectric properties of wire made from lot A exhibits a positive calibration error increasing with temperatures. The calibration error of wire made from a second lot, lot B, of a comparable alloy powder is shown as curve 28. Curve 28 exhibits a negative calibration error which increases with temperature. Curve 30 represents the calibration error of a thermocouple wire made from a blended mixture comprising 50% of lot A and 50% of lot B. The calibration error of the 50/50 blend of lot A with lot B approaches a zero (0) calibration error.

It should be recognized that when the magnitudes of the calibration errors of lots A and B differ from the illustrated example, the ratio between the quantities of lot A blended with lot B may differ from the 50/50 ratio of the illustrated example.

An object of the blend of the two lots of powdered alloys is to reduce the calibration error to the smallest possible value.

Figure 3:
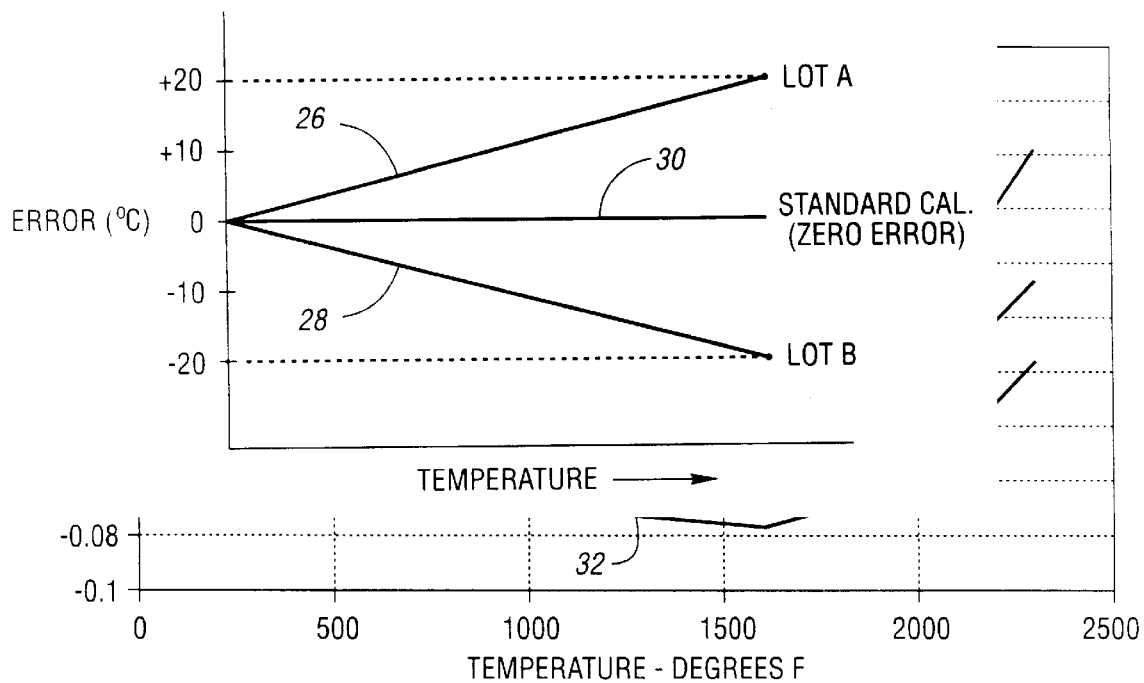
FIG. 3 is a graph showing the calibration error of a first actual example.

FIG. 3 illustrates the calibration error curves of two different lots of powdered alloy known in the art by the trade name ALUMEL™. Curve 32, represents lot 265 of powdered ALUMEL™ while curve 34 represents lot 267 of powdered ALUMEL™. The calibration error curves of the two lots of powdered alloys differ. ALUMEL™ is a standard alloy used for thermocouples wire. It has a chemical composition of about 95% nickel, 2% aluminum, 2% manganese and 1% silicon. Curve 36 is the calibration error curve of an ALUMEL™ thermocouple wire made from 50% lot 265 and 50% lot 267 blended together.

Figure 4:
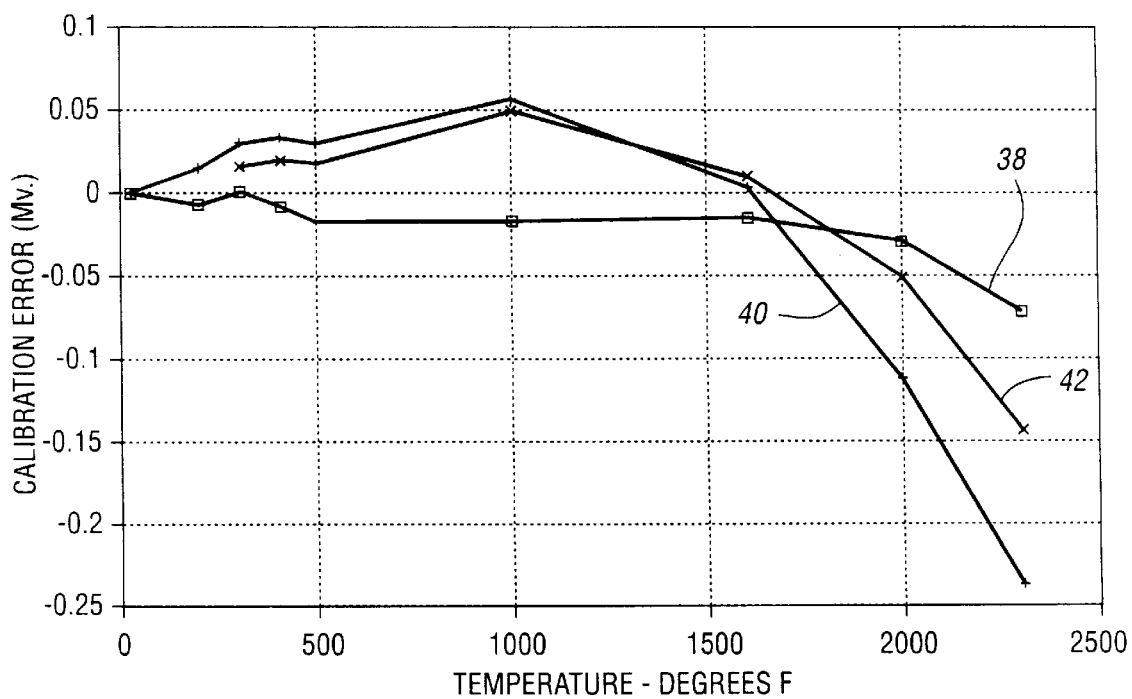
FIG. 4 is a graph showing the calibration error of a second actual example.

FIG. 4 illustrates the calibration error curves of two different lots of powdered alloy commonly known by the trade name CHROMEL™ and the calibration error curve of a thermocouple wire made from a blend of the two different lots. CHROMEL™ is an alloy widely used in the making of thermocouple wire. It has a chemical composition consisting of about 90% nickel and 10% chromium by weight. Curve 38 illustrates the calibration error, in millivolts, of wire made from lot 637 of powdered CHROMEL™, curve 40 shows the calibration error curve of made from lot 708 of powdered CHROMEL™ and curve 42 shows the calibration error of a thermocouple wire made from a blend consisting of 50% lot 708 and 50% lot 637.

As shown by the actual examples, the calibration error of thermocouple wires made from powdered alloys can be altered by blending selected lots of powdered alloy. Although the CHROMEL™ and ALUMEL™ alloys are used in the illustrated examples, it is appreciated that any other alloys used in thermocouples may be reduced to a powdered state and blended with other lots of the same alloy to reduce the calibration error of the resultant thermocouple wire.

In addition to blending two different lots of powdered alloys to form thermocouple wires having minimum calibration errors, it is also possible to blend a pure powdered metal with a powdered alloy to correct for minor thermoelectric errors in the thermocouple wire made from the powdered alloy. For example, powdered chromium may be added to a batch of powdered CHROMEL™ to correct for a deficiency of chromium in the original powdered CHROMEL™ alloy and therefore reduce the calibration error in the thermocouple wire made from the powdered alloy.

Alternatively, different powdered metals may be blended to form a thermocouple alloy. For example, the predetermined quantities of powdered chromium and powdered nickel may be blended to form CHROMEL™ thermocouple wire. It is also purported that other powdered metals may be blended, compressed, and hot extruded to form any of the thermocouple wires known in the art.

It further has been found that a small addition, approximately 0.5% by weight, of an inert ceramic powder, such as yittrium oxide will reduce grain growth at high temperatures resulting in a reduction of mechanical failures.

It is recognized that those skilled in the art may make changes and/or improvements to the disclosed method for making thermocouple wires within the scope of the disclosed invention. It is not intended that the invention be limited to the disclosed embodiments as set forth in the claims.

What is claimed is:

1. A method for making thermocouple wire comprising:
   preparing a molten alloy from which the thermocouple wire is to be formed;
   reducing said molten alloy to a first lot of powdered alloy; and
   forming thermocouple wire from said powdered alloy.

2. The method of claim 1 wherein said forming the thermocouple wire includes:
   compacting and hot working said powdered alloy to form a rod, and
   cold drawing said rod to form said thermocouple wire.

3. The method of claim 2 wherein said compacting and hot working said powder alloy comprises:
   loading said powder alloy into a metal can;
   sealing said metal can loaded with said powdered alloy;
   compacting said sealed metal can to form a compacted can;

hot drawing said compacted can to form a coated rod having a residue of said metal can extending along its external surface; and removing said residue of said metal can from said external surface to form said rod.

4. The method of claim 2 wherein said compacting and hot working comprises:

loading said powder alloy into a metal can;

sealing said metal can loaded with said powdered alloy;

hot drawing said sealed metal can to form a coated rod having a residue of said metal can extending along its external surface; and removing said residue of said can from said external surface to form said rod.

5. The method of claim 2 wherein said reducing said molten alloy to a powdered alloy includes:

forming a fine liquid stream of said molten alloy; and disintegrating said liquid stream of molten alloy to produce said powdered alloy consisting of individual small solidified alloy particles.

6. The method of claim 5 wherein said molten alloy is prepared in a vat, said forming a fine liquid stream comprises ejecting said fine liquid stream of molten alloy from said vat through an orifice provided in the bottom of the vat.

7. The method of claim 5 wherein disintegrating said liquid stream of molten alloy comprises the engaging said liquid stream of molten alloy with at least one jet of a high pressure gas.

8. The method of claim 1 further including:

preparing at least a second lot of powdered alloy having a chemical composition substantially the same as said first lot of powdered alloy;

blending a predetermined quantity of said second lot of powdered alloy with a predetermined quantity of said first lot of powdered alloy to form a blend of powdered alloy; and wherein said forming thermocouple wire forms said thermocouple wire from said blend of powdered alloy.

9. The method of claim 8 wherein said blending further includes blending a small quantity of an inert ceramic powder with said first and second lots of powdered alloys to reduce grain growth at high temperatures.

10. The method of claim 8 wherein said first and said at least a second lot of alloy powders are selected to have offsetting calibration errors.

11. The method of claim 10 wherein a ratio between said first and said at least a second lot of powdered alloy is selected to minimize the calibration error of thermocouple wire made from said blend of powdered alloys.

12. The method of claim 1 wherein said alloy is CHROMEL™ having a chemical composition consisting generally of 90% nickel and 10% chromium by weight.

13. The method of claim 1 wherein said alloy is ALUMEL™ having a chemical composition consisting generally of 95% nickel, 2% aluminum, 2% manganese and 1% silicon.

14. A method for making thermocouple wire comprising:

preparing a first lot of a powdered alloy having a preselected chemical composition;

preparing at least a second lot of powdered alloy having substantially the same chemical composition as said first lot of powdered alloy;

blending a first predetermined quantity of said first powdered alloy with a second predetermined quantity of said at least a second lot of powdered alloy to form a blended powdered alloy;

compacting said blended powdered alloy to form a rod; and cold drawing said rod to produce said thermocouple wire.

15. The method of claim 14 wherein said blending further includes blending a small quantity of an inert ceramic powder to said first and second lots of powdered alloys to reduce grain growth at high temperatures.

16. The method of claim 14 further including:

measuring the thermoelectric properties of said first powdered alloy to generate a first calibration error;

measuring the thermoelectric properties of said at least a second powdered alloy to generate a second calibration error; and selecting one of said at least a second powdered alloy having a calibration error in a direction opposite said first lot of powdered alloy to be blended with said first powdered alloy so that the calibration error of the thermocouple wire made from said blend of first said powdered alloy is less than said calibration error of said first and said selected one of said at least a second powdered alloy.

17. The method of claim 16 wherein the ratio of the quantity of said selected one of said at least a second lot of powdered alloy with the quantity of said first lot of powdered alloy is selected such that the calibration error of thermocouple wire made from said blended powdered alloy is minimized.

18. A method for making thermocouple wire comprising:

preparing a lot of a powdered alloy;

determining the thermoelectric properties of a thermoelectric wire made from said lot of said powdered alloy;

blending said lot of powdered alloy with a powdered metal to form a blended lot, said powdered metal selected to minimize the calibration error of a thermoelectric wire made from the blended lot of powdered alloy and said powdered metal; and forming thermoelectric wire from said blended lot.

19. The method of claim 18 further including blending a small quantity of an inert ceramic powder with said lot of powdered alloy and said lot of powdered metal to reduce grain growth at high temperatures.

20. The method of claim 18 wherein said forming thermocouple wire comprises compacting said blended lot to form a compacted rod; and hot extruding said compacted rod to form said thermocouple wire.

21. The method of claim 20 wherein said compacting comprises:

filling a metal can with said blended lot;

seating said metal can with said blended lot inside;

hot drawing said sealed metal can to form a coated rod having a residue of said metal can along its external surface; and removing of said residue of said can from said coated rod to form said compacted rod.

22. The method of claim 21 further including compacting said filled metal can prior to hot drawing.

23. A method for making a thermocouple wire comprising:

blending a lot of a first powdered metal with a predetermined quantity of at least a second powdered metal to form a blended lot;

compacting said blended lot to form a compacted rod; and hot extruding said compacted rod to form a thermocouple wire.

24. The method of claim 23 further including blending a small quantity of an inert ceramic powder to said blended lot to reduce grain growth at elevated temperatures.

25. The method of claim 23 wherein said compacting comprises:

filling a metal can with said blended lot;

sealing said filled metal can;

hot drawing said sealed metal can to form a coated rod having a residue of said metal can along its external surface; and removing said residue of said metal can from the surface of said coated rod to form said compacted rod.

26. The method of claim 25 further including compacting said filled metal can prior to said hot drawing.

27. The method of claim 22 wherein said removing of said residue of said can comprises mechanically removing said residue.

28. The method of claim 22 wherein said removing of said residue of said metal can comprises chemically removing said residue.

* * * * *